United States Patent
Muza

(10) Patent No.: US 8,981,535 B2
(45) Date of Patent: Mar. 17, 2015

(54) CHARGE PUMP CAPACITOR ASSEMBLY WITH SILICON ETCHING

(71) Applicant: Robert Bosch GmbH, Stuttgart (DE)

(72) Inventor: John M. Muza, Venetia, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/039,033

(22) Filed: Sep. 27, 2013

(65) Prior Publication Data

US 2014/0319658 A1  Oct. 30, 2014

Related U.S. Application Data

(60) Provisional application No. 61/817,523, filed on Apr. 30, 2013.

(51) Int. Cl.

| | |
|---|---|
| H01L 29/84 | (2006.01) |
| H01L 29/06 | (2006.01) |
| H01L 49/02 | (2006.01) |
| H01L 27/02 | (2006.01) |
| H01L 27/08 | (2006.01) |
| H02M 3/07 | (2006.01) |

(52) U.S. Cl.
CPC ............ *H01L 29/0607* (2013.01); *H01L 28/40* (2013.01); *H01L 27/0222* (2013.01); *H01L 27/0805* (2013.01); *H02M 3/07* (2013.01)
USPC ......................................... 257/632; 257/416

(58) Field of Classification Search
CPC ...................................................... H01L 29/84
USPC ................................................. 257/632, 416
See application file for complete search history.

(56) References Cited

U.S. PATENT DOCUMENTS

| | | | |
|---|---|---|---|
| 5,754,476 A * | 5/1998 | Caser et al. ............... | 365/185.29 |
| 5,786,617 A | 7/1998 | Merrill et al. | |
| 7,203,118 B2 | 4/2007 | Yaoi et al. | |
| 7,439,795 B2 | 10/2008 | Yanagigawa et al. | |
| 8,085,524 B2 | 12/2011 | Roozeboom et al. | |
| 2002/0005485 A1 | 1/2002 | Hashimoto et al. | |
| 2003/0071297 A1* | 4/2003 | Hara et al. ................... | 257/298 |
| 2006/0274476 A1 | 12/2006 | Cervin-Lawry et al. | |
| 2010/0155864 A1* | 6/2010 | Laming et al. ................ | 257/416 |
| 2010/0166229 A1 | 7/2010 | Pennock et al. | |
| 2010/0288047 A1 | 11/2010 | Takagi | |
| 2013/0051583 A1 | 2/2013 | Gueorguiev | |

OTHER PUBLICATIONS

International Search Report and Written Opinion for Application No. PCT/US2014/036171 dated Sep. 30, 2014 (13 pages).

* cited by examiner

*Primary Examiner* — Marc Armand
(74) *Attorney, Agent, or Firm* — Michael Best & Friedrich LLP

(57) ABSTRACT

Charge pump capacitor assemblies and methods of manufacturing the same. One charge pump capacitor assembly includes a charge pump capacitor and a silicon substrate. The charge pump capacitor includes: a silicon-based charge pump capacitor oxide layer, a first terminal on a first side of the silicon-based charge pump layer, a second terminal on a second side of the silicon-based charge pump capacitor oxide layer opposite the first side, and a field oxide layer mounted adjacent the second terminal. The charge pump capacitor is coupled to the silicon substrate. The silicon substrate is etched to reduce contact between the silicon substrate and the field oxide layer.

17 Claims, 3 Drawing Sheets

CHARGE PUMP CAPACITOR ASSEMBLY WITH SILICON ETCHING

RELATED APPLICATIONS

The present application claims priority to U.S. Provisional Patent Application No. 61/817,523 filed Apr. 30, 2013, the entire contents of which is incorporated by reference herein.

BACKGROUND

The present invention relates to microelectromechanical system ("MEMS") devices, such as microphone systems, that include a charge-pump component.

SUMMARY

Some MEMS microphones (e.g., included in cellular phones, headsets, personal computers, etc.) include a charge pump to boost the bias voltage applied to a capacitive sensor above the power supply voltage. However, in some microphone systems, the construction of a charge pump can result in a parasitic capacitance in the field oxide layer. As a result, a larger amount of charge pump current consumption is due to wasted charging and discharging of a capacitor to ground.

Accordingly, embodiments of the invention provide charge pump assemblies and methods of manufacturing the same. In particular, one embodiment of the invention provides a charge pump capacitor assembly. The charge pump capacitor assembly includes a charge pump and a substrate. The charge pump includes a silicon-based charge pump layer, a first terminal on a first side of the silicon-based charge pump layer, a second terminal on a second side of the silicon-based charge pump layer opposite the first side, and a field oxide layer mounted adjacent the second terminal. The charge pump is coupled to the substrate, and the substrate is etched to reduce contact between the substrate and the field oxide layer. In particular, the substrate is etched such that the substrate does not provide a ground for the field oxide layer.

Another embodiment of the invention provides a method of manufacturing a charge pump capacitor assembly. The method includes forming a field oxide layer on a substrate, forming a first charge pump terminal on the field oxide layer, forming a charge pump layer on top of the first terminal, and forming a second charge pump terminal on top of the charge pump layer to create a charge pump between the first charge pump terminal and the second charge pump terminal. The method also includes etching the substrate to reduce contact between the substrate and the field oxide layer.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
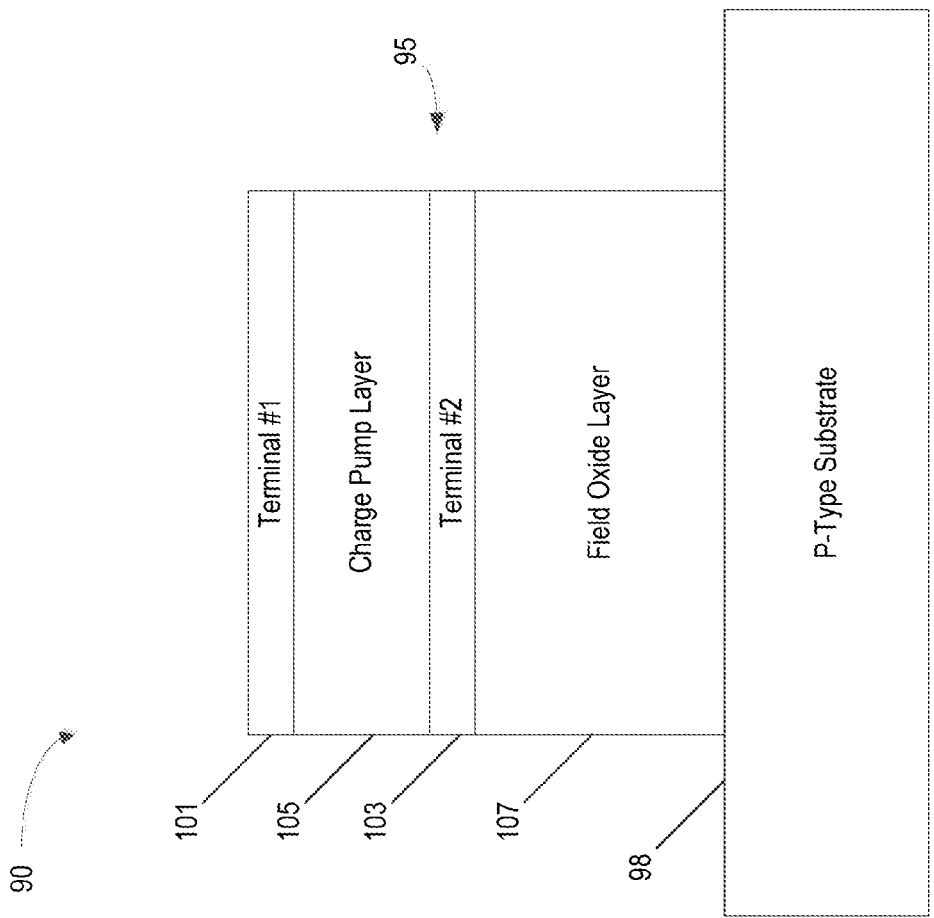
FIG. 1 is a cross-sectional view of an existing charge pump capacitor assembly.

FIG. 1 schematically illustrates a cross-sectional view of an existing charge pump capacitor assembly 90. The assembly 90 includes a charge pump capacitor 95 and a silicon substrate 98 (e.g., a p-type substrate). The charge pump capacitor 95 includes a first charge pump terminal 101 and a second charge pump terminal 103. The first terminal 101 and the second terminal 103 are formed on either side of a charge pump layer 105. The charge pump capacitor oxide layer 105 is mounted on a field oxide layer 107 such that the field oxide layer 107 is positioned adjacent to the second terminal 103. The charge pump capacitor 95 is coupled to the silicon substrate 98.

Figure 2:
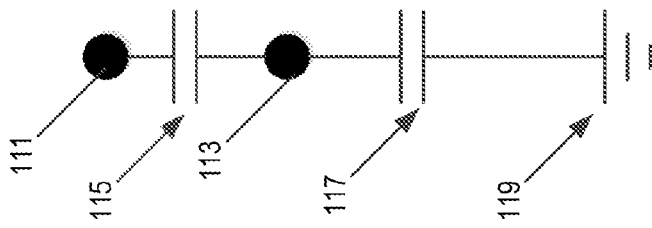
FIG. 2 is a circuit schematic of the electrical operation of the charge pump capacitor assembly of FIG. 1.

FIG. 2 illustrates electrical operation of the charge pump capacitor assembly 90. As illustrated in FIG. 2, the first terminal 101 acts as a first node 111 of the circuit. The second terminal 103 operates as a second node 113 while the charge pump capacitor oxide layer 105 operates as a capacitor 115 between the first node 111 and the second node 113. Because the substrate 98 serves as a ground 119 for the chge pump 95, the field oxide layer 107 operates as a parasitic capacitor 117 that is repeatedly charged and discharged to ground 119. This repeated charging and discharging results in significant power loss for the charge pump 95.

Figures 3, 4:
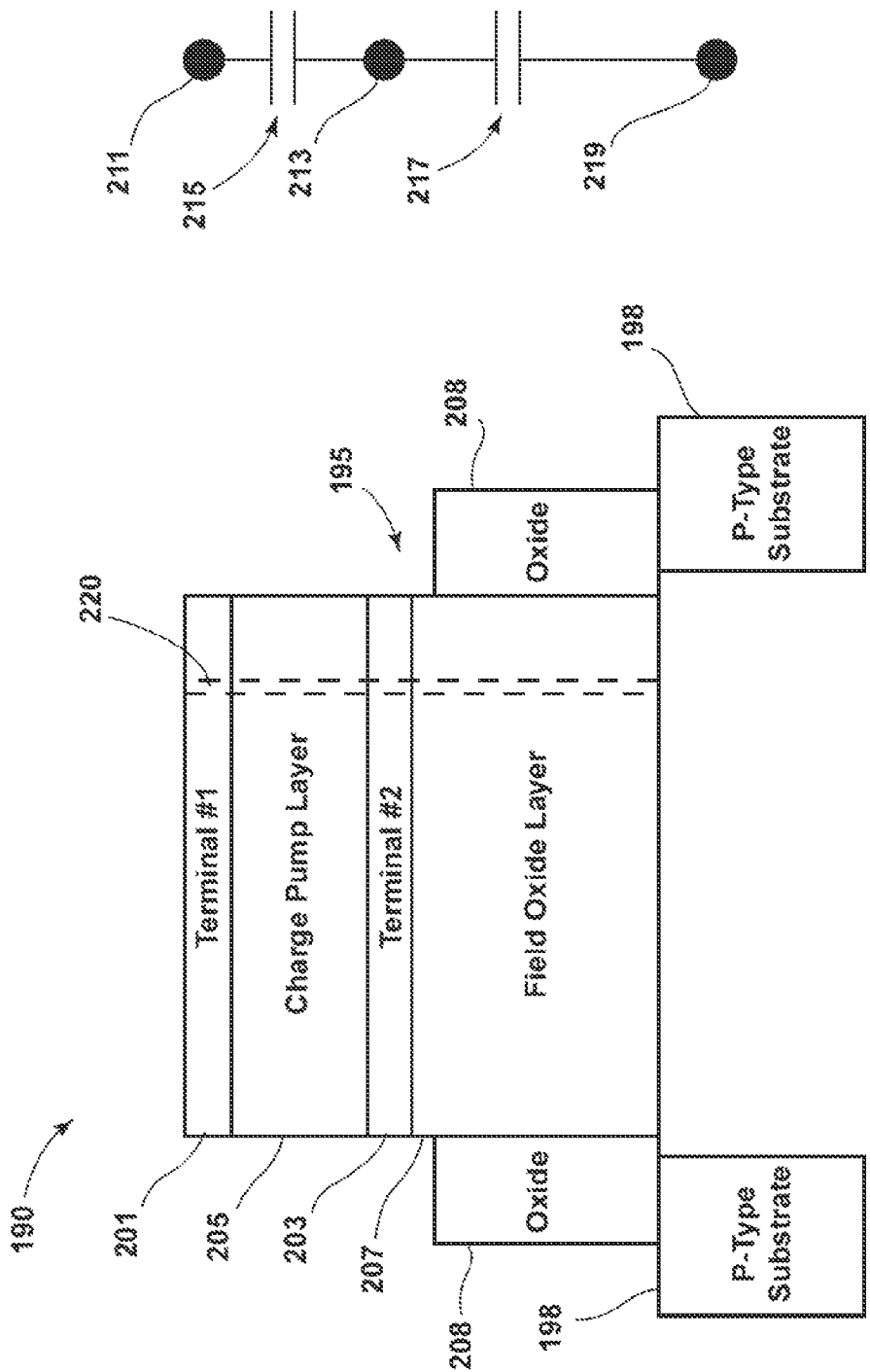
FIG. 3 is a cross-sectional view of a charge pump capacitor assembly according to one embodiment of the invention.
FIG. 4 is a circuit schematic of the electrical operation of the charge pump capacitor assembly of FIG. 3.
Figure 3A:
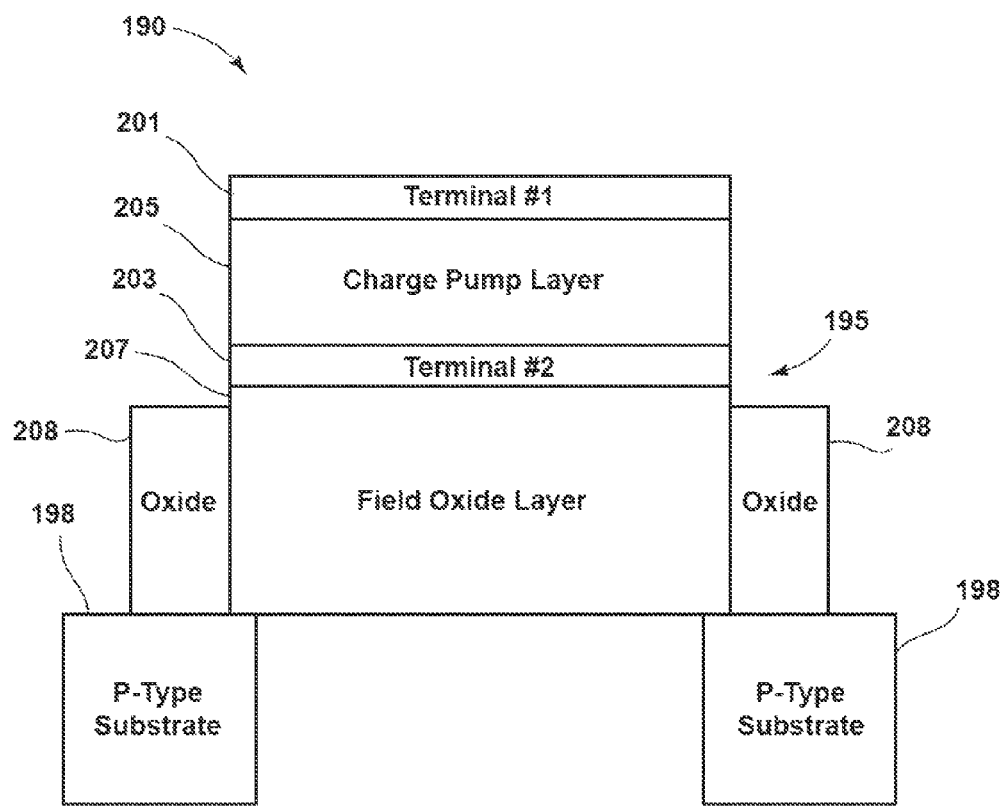
FIG. 3A is a cross-sectional view of a charge pump capacitor assembly according to one embodiment of the invention.

FIG. 3 schematically illustrates a cross-sectional view of a charge pump capacitor assembly 190 according to one embodiment of the invention. The assembly 190 includes a charge pump capacitor 195 and a silicon substrate 198 (e.g., a p-type substrate or an n-type substrate). The charge pump capacitor195 includes a first charge pump terminal 201 and a second charge pump terminal 203 positioned on opposite sides of a charge pump layer 205, which is positioned on a field oxide layer 207. In particular, the first terminal 201 is formed on one side of the charge pump layer 205, and the second terminal 203 is formed on an opposite side of the charge pump capacitor oxide layer 205 that is adjacent the field oxide layer 207. The charge pump capacitor 195 is coupled to the silicon substrate 198. However, as illustrated in FIG. 3A, a silicon etch is performed in the substrate 198 to remove at least a portion of the substrate 198 that would contact the field oxide layer 207. Removing a portion of the substrate 198 that otherwise contacts the field oxide layer 207 reduces the surface area between these components, which results in less charge flow over the surface area and, consequently, less energy loss. Also, in some embodiments as shown in FIG. 3, there is no contact between the field oxide layer 207 and the silicon substrate 198. Accordingly, in these embodiments, the substrate 198 does not provide a ground for the field oxide layer 207. It should be understood that although the portion of the substrate 198 is removed below the field oxide layer 207, oxides 208 on the side and on top of the charge pump capacitor 195 provide mechanical stability for the assembly 190 and couple the charge pump capacitor 195 to the substrate 198.

The charge pump capacitor oxide layer 205 is formed of silicon oxide ($SiO_2$), silicon nitride (SiN), and/or other suitable material. In some constructions, the first terminal 201 and the second terminal 203 each include a metal contact. However, in other constructions, the first terminal 201 simply includes the top surface of the charge pump capacitor oxide layer 205, and the second terminal 203 includes the junction of the charge pump capacitor oxide layer 205 and a field oxide layer 207.

FIG. 4 illustrates electrical operation of the charge pump capacitor assembly 190. As illustrated in FIG. 4, the first terminal 201 serves as a first node 211 and the second terminal 203 serves as a second node 213. The charge pump capacitor oxide layer 205 acts as a capacitor 215 between the first node 211 and the second node 213. However, because the silicon substrate 198 has been etched to eliminate contact between the substrate 198 and the field oxide layer 207, the substrate 198 does not provide a ground for the circuit. In particular, the air gap formed by the etched substrate 198 serves as a floating node 219. The field oxide layer 207 still operates as a parasitic capacitor 217 between the second node 213 and the floating node 219. However, dominant current consumption component in the charge pump capacitor assembly 90 are removed in the charge pump capacitor assembly 190 and, consequently, the electrical voltage gain of a MEMS sensor that is driven by the charge pump 95 is improved.

To create the charge pump capacitor assembly 190, the field oxide layer 207 is formed on the substrate 198. The second terminal 203 is formed on the field oxide layer 207 and the charge pump capacitor oxide layer 205 is formed on top of the second terminal 203. The first terminal 203 is also formed on top of the charge pump layer 205 to create the charge pump 195 between the first terminal 201 and the second terminal 203. The substrate 198 is then etched to reduce contact between the substrate 198 and the field oxide layer 207. In some embodiments, the substrate 198 is etched to eliminate contact between the substrate 198 and the field oxide layer 207. It should be understood that the substrate 198 can be etched at any point during the manufacturing process. Also, because there is air below the field oxide layer 207 (due to the etched portion of the silicon substrate 198), when the assembly 190 is glued down under heat air pressure forms in the etched portion. If the air pressure gets too great, it could crack or damage the charge pump capacitor 195. Therefore, in some embodiments, a safety pressure relief hole 220 as shown in FIG. 3 is formed in the charge pump capacitor 195 from the top to the bottom (e.g., through the first terminal 201, the charge pump capacitor oxide layer 205, the second terminal 203, and the field oxide layer 207) to release at least a portion of the air pressure.

Thus, the invention provides, among other things, a charge pump capacitor assembly that eliminates the substrate as a ground by etching the substrate such that the field oxide layer does not contact the substrate.

Various features and advantages of the invention are set forth in the following claims.

What is claimed is:

1. A charge pump capacitor assembly comprising:
   a charge pump including
   a silicon-based charge pump capacitor oxide layer,
   a first terminal on a first side of the silicon-based charge pump layer,
   a second terminal on a second side of the silicon-based charge pump layer opposite the first side, and
   a field oxide layer mounted adjacent the second terminal;
   and
   a silicon substrate coupled to the charge pump, wherein the substrate is etched forming an air gap between the silicon substrate and the field oxide layer.

2. The charge pump capacitor assembly of claim 1, wherein the silicon substrate is etched to eliminate contact between the silicon substrate and the field oxide layer.

3. The charge pump capacitor assembly of claim 1, wherein the first terminal includes a metal contact.

4. The charge pump capacitor assembly of claim 1, wherein the first terminal includes a surface of the charge pump capacitor oxide layer on the first side.

5. The charge pump capacitor assembly of claim 1, wherein the second terminal includes a metal contact.

6. The charge pump capacitor assembly of claim 1, wherein the charge pump capacitor oxide layer is formed of silicon oxide.

7. The charge pump capacitor assembly of claim 1, wherein the charge pump capacitor oxide layer is formed of silicon nitride.

8. The charge pump capacitor assembly of claim 1, wherein the field oxide layer operates as a parasitic capacitor between the second terminal and the silicon substrate.

9. The charge pump capacitor assembly of claim 1, further comprising a pressure relief hole formed through the first terminal, the charge pump capacitor oxide layer, the second terminal, and the field oxide layer to provide a pressure relief path from the air gap to a top of the charge pump.

10. A charge pump capacitor assembly for increasing the electrical voltage gain of a MEMS sensor comprising:
    a charge pump capacitor comprising:
    a silicon-based charge pump layer,
    a first charge pump terminal disposed in contact with a first side of the silicon-based charge pump layer and comprising a first node,
    a second charge pump terminal disposed in contact with a second side of the silicon-based charge pump layer opposite the first side and comprising a second node, and
    a field oxide layer mounted adjacent the second charge pump terminal;
    and
    a silicon substrate coupled to the charge pump capacitor, the silicon substrate being etched to reduce contact between the silicon substrate and the field oxide layer of the charge pump capacitor by forming an air gap that serves as a floating node, the air gap resulting in a reduced contact area between the silicon substrate and the field oxide layer resulting in less charge flow over the surface area and less energy loss.

11. The charge pump capacitor assembly of claim 10, wherein the silicon substrate is etched to eliminate contact between the silicon substrate and the field oxide layer, and wherein oxides on the side and on top of the charge pump capacitor provide mechanical stability for the charge pump capacitor assembly and couple the charge pump capacitor to the silicon substrate.

12. The charge pump capacitor assembly of claim 10, further comprising a pressure relief hole formed through the first charge pump terminal, the charge pump capacitor oxide layer, the second charge pump terminal, and the field oxide layer to provide a pressure relief path from the air gap to a top of the charge pump capacitor.

13. The charge pump capacitor assembly of claim 10, wherein the first charge pump terminal includes a metal contact.

14. The charge pump capacitor assembly of claim 10, wherein the field oxide layer operates as a parasitic capacitor between the second node and the floating node.

15. The charge pump capacitor assembly of claim 13, wherein the second charge pump terminal includes a metal contact.

16. The charge pump capacitor assembly of claim 15, wherein the charge pump capacitor oxide layer is formed of silicon oxide.

17. The charge pump capacitor assembly of claim 15, wherein the charge pump capacitor oxide layer is formed of silicon nitride.

* * * * *